United States Patent
Jeong

(10) Patent No.: US 7,656,718 B2
(45) Date of Patent: Feb. 2, 2010

(54) SEMICONDUCTOR DEVICE HAVING OUTPUT BUFFER INITIALIZATION CIRCUIT AND OUTPUT BUFFER INITIALIZATION METHOD

(75) Inventor: Yong-Gwon Jeong, Gunpo-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 182 days.

(21) Appl. No.: 11/747,041

(22) Filed: May 10, 2007

(65) Prior Publication Data

US 2008/0037334 A1 Feb. 14, 2008

(30) Foreign Application Priority Data

Jul. 18, 2006 (KR) ............... 10-2006-0066933

(51) Int. Cl.
  *G11C 11/00* (2006.01)
(52) U.S. Cl. ............... 365/189.05; 365/226
(58) Field of Classification Search ........... 365/189.05, 365/226
  See application file for complete search history.

(56) References Cited

U.S. PATENT DOCUMENTS 6,178,137 B1 1/2001 Uchihira

2006/0139051 A1* 6/2006 Gallo et al. ............... 326/30
2007/0063730 A1* 3/2007 Gallo et al. ............... 326/27

FOREIGN PATENT DOCUMENTS

| JP | 11-045581 | 2/1999 |
| JP | 2001-101864 | 4/2001 |
| KR | 1020030085842 A | 11/2003 |

* cited by examiner

*Primary Examiner*—Michael T Tran
(74) *Attorney, Agent, or Firm*—F. Chau & Associates, LLC

(57) ABSTRACT

A semiconductor device has at least two semiconductor memory devices, each of which includes a memory cell array arranged in a matrix of rows and columns, a peripheral circuit writing data to a cell of the memory cell array and reading out and amplifying the written data, and an output buffer outputting cell data amplified by the peripheral circuit. The output buffer includes an output buffer initialization circuit activating an output buffer reset signal in response to the power up or power down of the semiconductor memory device and deactivating the output buffer reset signal in response to a first command signal output from a controller of the semiconductor memory device, and an output driver generating output data based on a data signal in response to a clock signal, a data enable signal, and the output buffer reset signal.

4 Claims, 9 Drawing Sheets

SEMICONDUCTOR DEVICE HAVING OUTPUT BUFFER INITIALIZATION CIRCUIT AND OUTPUT BUFFER INITIALIZATION METHOD

CROSS-REFERENCE TO RELATED PATENT APPLICATION

This application claims priority under 35 U.S.C. § 119 from Korean Patent Application No. 2006-0066933, filed an Jul. 18, 2006, the disclosure of which is hereby incorporated by reference herein as if set forth in its entirety.

BACKGROUND OF THE INVENTION

1. Technical Field

The present disclosure relates to a semiconductor device and, more particularly, to a semiconductor device having an output buffer initialization circuit to prevent the loss of data output from a memory device just after another memory device is powered up in a multi-chip package (MCP) having at least two memory devices, and also to an output buffer initialization method.

2. Discussion of Related Art

A multi-chip package (MCP) is a multi-chip device in which various types of memory chips are stacked in a single package. The MCP may combine necessary memories according to applied products, and is a semiconductor device contributing greatly to the efficient use of space in a portable device, such as a mobile phone.

FIG. 1 is a functional block diagram of a general MCP. Referring to FIG. 1, the MCP 10 includes a first, memory 20 and a second memory 30. The first memory 20 and the second memory 30 can be embodied by volatile memory devices such as RAMs or non-volatile memory devices such as ROMs, EEPROMs, or flash memories.

The first memory 20 includes a first memory cell array 22, a first peripheral circuit 24, and a first output buffer 26. The first memory cell array 22 includes a plurality of memory cells arranged in a matrix of rows and columns. The first peripheral circuit 24 writes data to a predetermined cell of the first memory cell array 22 and reads out and amplifies the written data. The first output buffer 26 outputs cell data amplified by the first peripheral circuit 24.

The second memory 30 includes a second memory cell array 32, a second peripheral circuit 34, and a second output buffer 36. The second memory cell array 32 includes a plurality of memory cells arranged in a matrix of rows and columns. The second peripheral circuit 34 writes data to a predetermined cell of the second memory cell array 32 and reads out and amplifies the written data. The second output buffer 36 outputs cell data amplified by the second peripheral circuit 34.

FIG. 2 is a functional block diagram of the output buffer of a conventional semiconductor device. FIG. 3 is a circuit diagram of an output buffer initialization circuit of the conventional semiconductor device shown in FIG. 2. Referring to FIGS. 1 through 3, the output buffer 26 or 36 of the semiconductor device 10 includes an output buffer initialization circuit 50 and an output buffer circuit 60.

The output buffer initialization circuit 50 receives a first set signal EVCCHB generated in response to the power up of a semiconductor memory device, for example, the first memory 20 of FIG. 1, and a second set signal PDPDE enabling the power down of the semiconductor memory device and generates an output buffer reset signal EVCCHB_DQ.

Referring to FIG. 3, the output buffer initialization circuit 50 includes a logic gate block 52 and a level shifter 54. The logic gate block 52 receives the first set signal EVCCHB and the second set signal PDPDE, performs a predetermined logic operation, and outputs a logic operation result C1. The level shifter 54 receives the logic operation result C1, converts the logic operation result C1 to a predetermined level, and outputs the output buffer reset signal EVCCHB_DQ.

The MCP 10 is formed by integrating various types of memory devices 20 and 30 in a single package. The output data of the memory devices 20 and 30 is output from a common output port (not shown). Thus, when any one of the memory devices, for example, the first memory 20, is powered up, the output data of the other memory device, for example, the second memory 30, may be affected. That is, an output end of the first output buffer 26 does not affect the data output from the other memory device (30) when it only maintains a high impedance (Hi-z) state.

When the first memory 20 is powered up and a clock signal CLKDQ input to the output buffer circuit 60 maintains a low level "0", however, the output buffer, for example, the first output buffer 26, becomes a low impedance state and may affect the data output from the other memory chip, for example, the second memory 30.

For example, when the clock signal CLKDQ maintains the low level "0", a pull-up transistor (not shown) or a pull-down transistor (not shown) included in the output buffer, for example, the first output buffer 26, may be tamed on by a leakage current flowing in a PMOS transistor or an NMOS transistor (not shown) constituting the output buffer circuit 60. Accordingly, an output node of the output buffer 26 can be in a low impedance state such that it may affect the data output from the other memory chip, for example, the second memory 30.

SUMMARY OF THE INVENTION

To solve the above and/or other problems, exemplary embodiments of the present invention provide an output buffer initialization circuit and method that does not affect data output from a memory chip when the other memory chip in a multi-chip package (MCP) is powered up or down.

According to an exemplary embodiment of the present invention, in a semiconductor device having at least two semiconductor memory devices, each semiconductor memory device comprises a memory cell array having a plurality of memory cells arranged in a matrix of rows and columns, a peripheral circuit writing data to a cell of the memory cell array and reading out and amplifying the written data, and an output buffer outputting cell data amplified by the peripheral circuit, wherein the output buffer comprises an output buffer initialization circuit activating an output buffer reset signal in response to the power up or power down of the semiconductor memory device and deactivating the output buffer reset signal in response to a first command signal output from a controller of the semiconductor memory device, and an output driver generating output data based on a data signal in response to a clock signal, a data enable signal, and the output buffer reset signal.

The output buffer initialization circuit comprises an output buffer reset circuit activating the output buffer reset signal based on a first set signal generated in response to the power up of the semiconductor memory device and a second set signal enabling the power down of the semiconductor memory device, and a latch circuit latching the output buffer reset signal, wherein the output driver places an output port in a high impedance state in response to the activation of the output buffer reset signal.

The first signal is a command signal that is input before a read command signal is input to the semiconductor memory device.

According to an exemplary embodiment of the present invention, an output buffer comprises an output buffer initialization circuit activating an output buffer reset signal in response to the power up or power down of a semiconductor memory device and deactivating the output buffer reset signal in response to a first command signal output from a controller of the semiconductor memory device, and an output driver generating output data based on a data signal in response to a clock signal, a data enable signal, and the output buffer reset signal.

The output buffer initialization circuit comprises an output buffer reset circuit activating the output buffer reset signal based on a first set signal generated in response to the power up of the semiconductor memory device and a second set signal enabling the power down of the semiconductor memory device, and a latch circuit latching the output buffer reset signal, wherein the output driver places an output port in a high impedance state in response to the activation of the output buffer reset signal.

The first signal is a command signal that is input before a read command signal is input to the semiconductor memory device.

The output buffer reset circuit comprises a first inverter receiving the first signal, a pull-up transistor connected between a first power voltage and an output node and turned on in response to an output signal of the first inverter, and a pull-down transistor connected between the output node and a second power voltage and turned on in response to an output signal of a logic gate block, wherein an output signal of the logic gate block is based on the first set signal and the second set signal.

The logic gate block comprises a NOR gate receiving the first set signal and the second set signal and performing a NOR operation and a second inverter receiving an output signal of the NOR gate and outputting an inverted signal.

According to an exemplary embodiment of the present invention, a method for initializing an output buffer of a semiconductor memory device comprises generating a first set signal in response to the power up or power down of the semiconductor memory device, activating an output buffer reset signal in response to the first set signal, placing an output port of the output buffer in a high impedance state in response to the activation of the output buffer reset signal, and deactivating the output buffer reset signal in response to the first signal generated by a controller of the semiconductor memory device.

The first signal is a command signal that is input before a read command signal is input to the semiconductor memory device.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Figure 1:
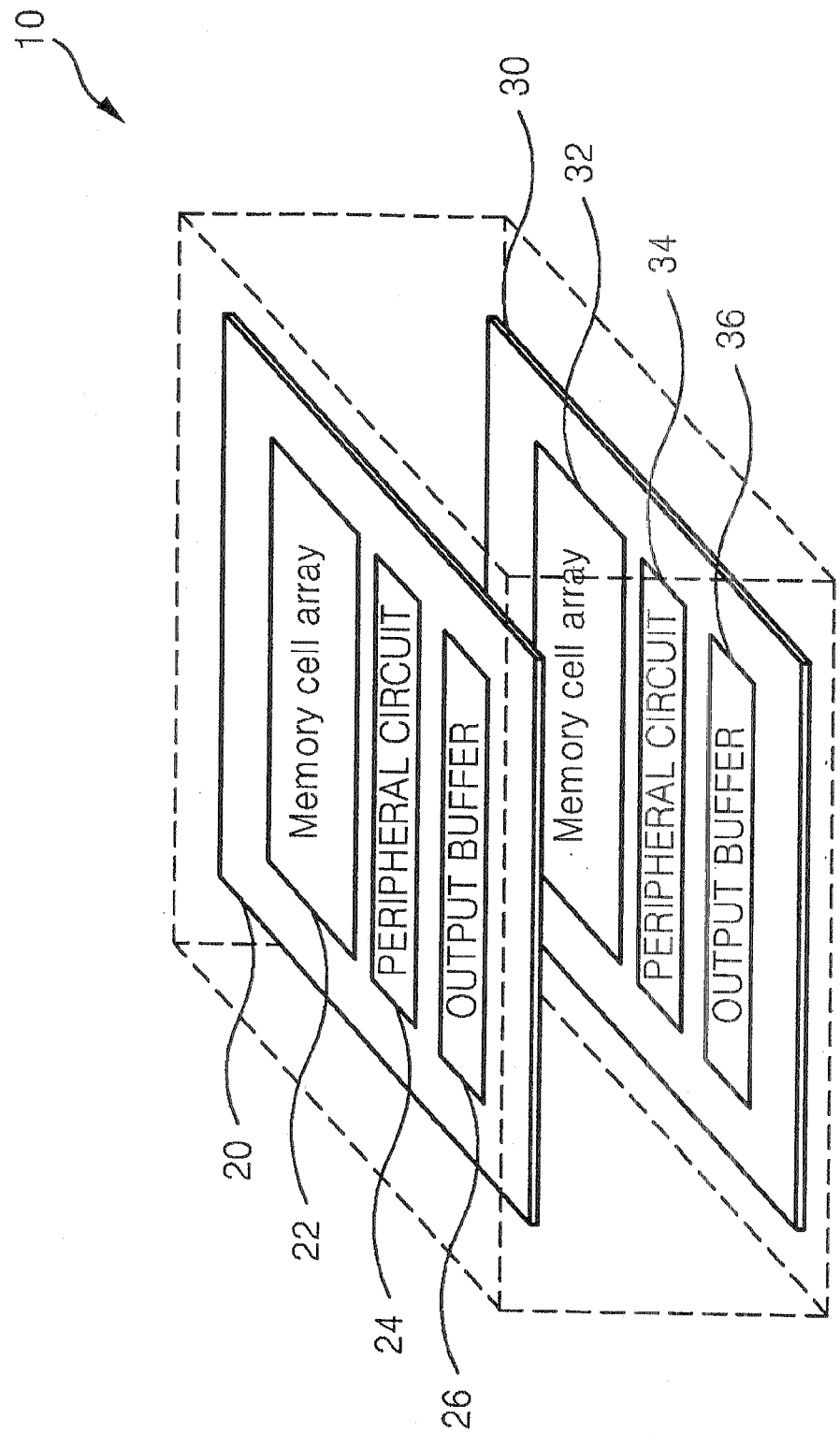
FIG. 1 is a functional block diagram of a conventional MCP.
Figure 2:
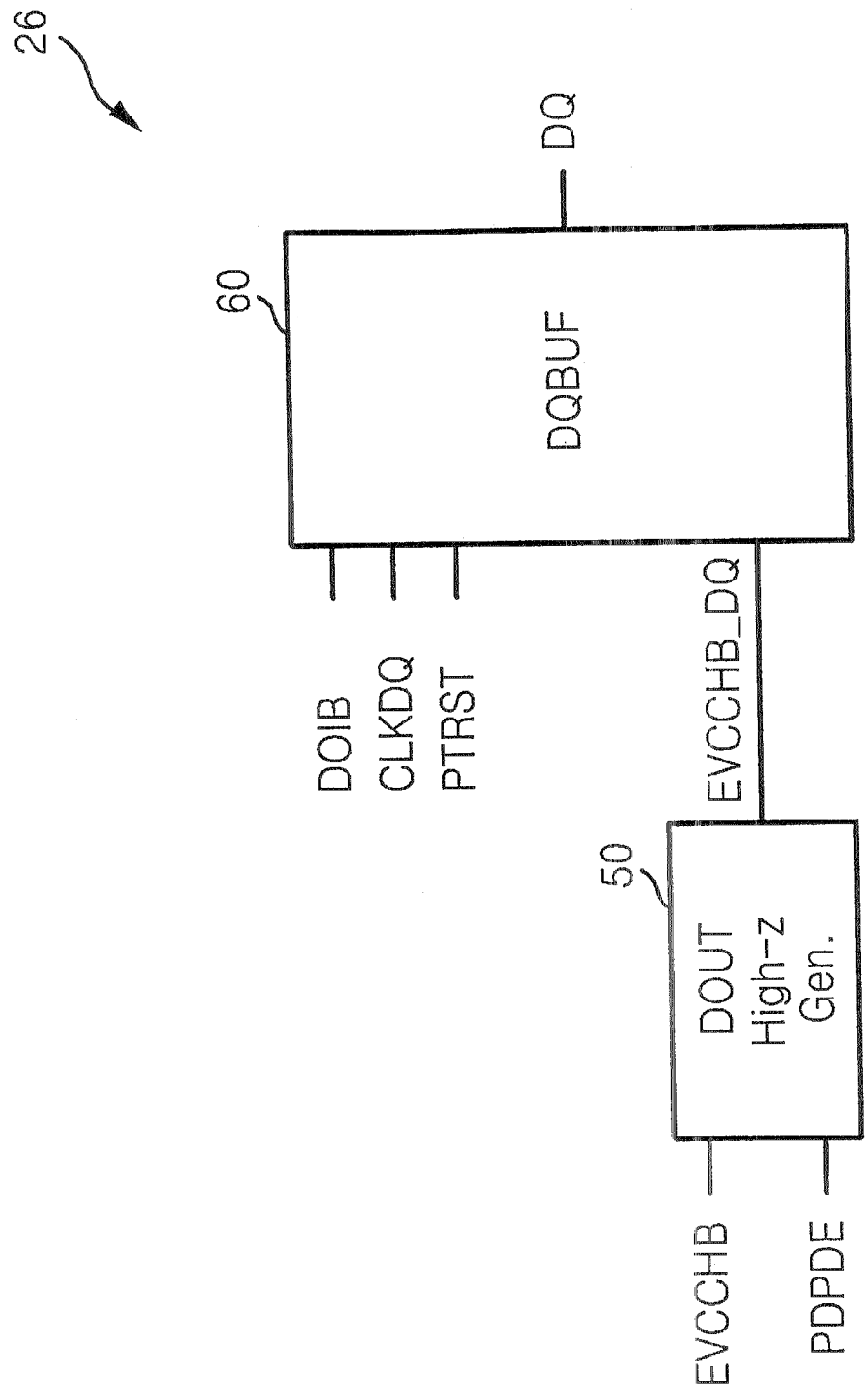
FIG. 2 is a functional block diagram of the output buffer of a conventional semiconductor device.

The present invention now will be described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, like numbers refer to like elements throughout.

Figure 4:
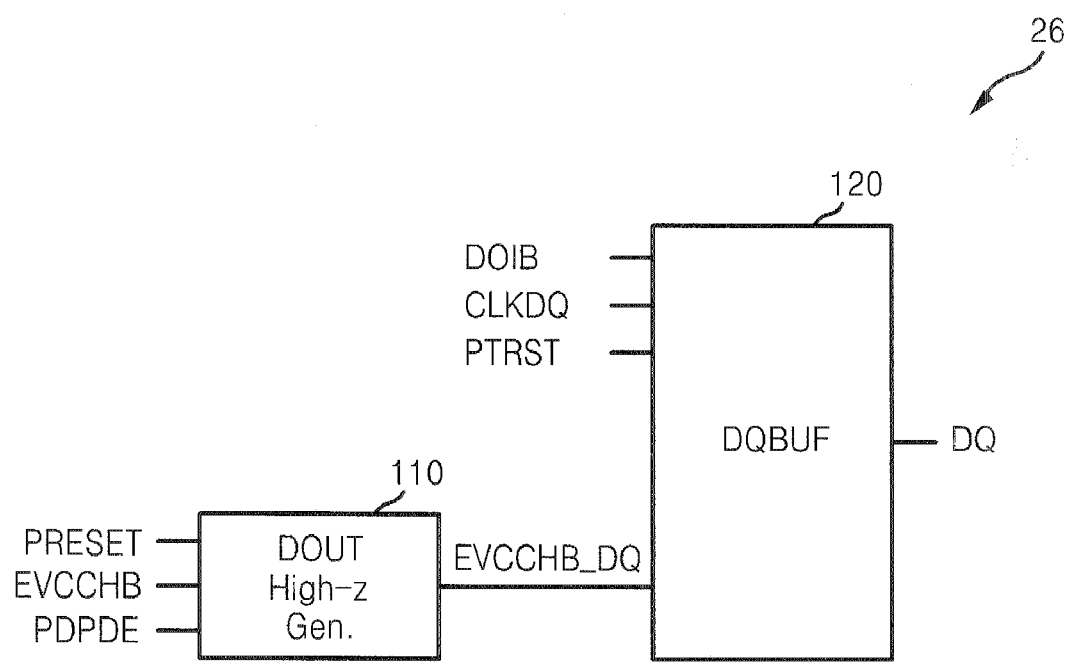
FIG. 4 is a functional block diagram of an output buffer of a semiconductor device according to an exemplary embodiment of the present invention.
Figure 5:
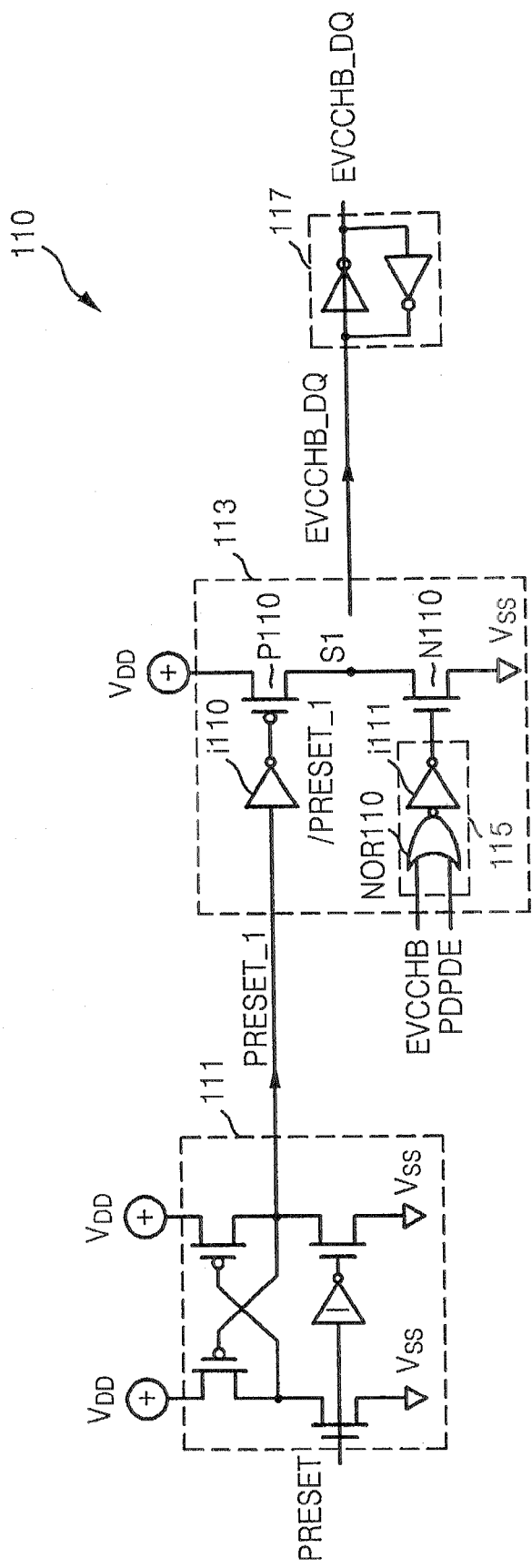
FIG. 5 is a circuit diagram of an output buffer initialization circuit of a semiconductor device according to an exemplary embodiment of the present invention.

FIG. 4 is a functional block diagram of an output buffer of a semiconductor device according to an exemplary embodiment of the present invention. FIG. 5 is a circuit diagram of an output buffer initialization circuit of a semiconductor device according to an exemplary embodiment of the present invention. Referring to FIGS. 4 and 5, an output buffer 26' outputs data of a cell amplified by a memory cell array (not shown) and includes an output buffer initialization circuit 110 and an output buffer circuit 120.

The output buffer initialization circuit 110 receives a first signal PRESET, the first set signal EVCCHB, and the second set signal PDPDE and initializes the output buffer circuit 120. The first signal PRESET is a predetermined command signal input before a read command signal is input to a semiconductor memory device. For example, the first signal PRESET is a predetermined command signal input before the read command signal is input and may comprise a precharge signal, a refresh signal, a write signal, a mode register set signal, and an active signal.

The output buffer initialization circuit 110 includes a level shifter 111, an output buffer reset circuit 113, and a latch circuit 117. The level shifter 111 outputs a second signal PRESET_1 converted to a predetermined level in response to the first signal PRESET based on a first power voltage VDD and a second power voltage VSS. The first and second power voltages VDD and VSS may be an external voltage supplied to the semiconductor device or a voltage generated internally and a ground voltage.

The output buffer reset circuit 113 receives the second signal PRESET_1, the first set signal EVCCHB, and the second set signal PDPDE and generates the output buffer reset signal EVCCHB_DQ that floats an output port of the output buffer. The output buffer reset circuit 113 includes a first inverter i110, a pull-up transistor P110, a pull-down transistor N110, and a logic gate block 115.

The first inverter i110 receives the second signal PRESET_1 and outputs an inverted second signal /PRESET_1. The pull-up transistor P110 is connected between the first power voltage VDD and an output node S1 and is turned on in response to the inverted second signal /PRESET_1 of the first inverter i110. The pull-down transistor N110 is connected between the output node S1 and the second power voltage VSS and turned on in response to an output signal of the logic gate block 115.

The logic gate block 115 includes a NOR gate NOR110 and a second inverter i111. The NOR gate NOR110 receives the first set signal EVCCHB and the second set signal PDPDE, performs a NOR operation, and outputs an operation result. The second inverter i111 receives the output signal of the NOR gate NOR110 and outputs an inverted signal. The latch circuit 117 latches the output buffer reset signal EVCCHB_DQ output from the output buffer reset circuit 113.

Figure 6:
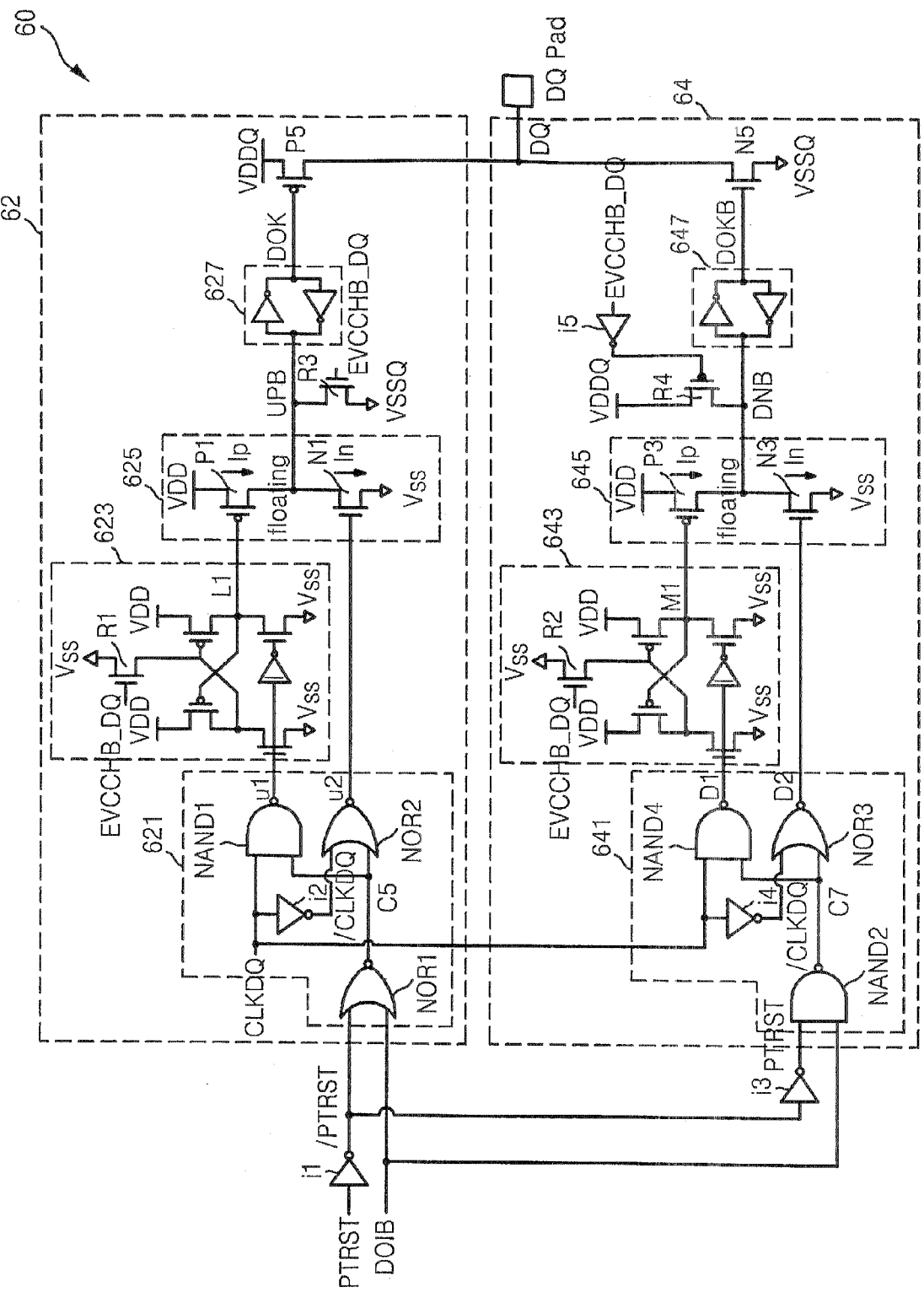
FIG. 6 is a circuit diagram of an output buffer circuit of a semiconductor device according to an exemplary embodiment of the present invention.

FIG. 6 shows an output buffer circuit of the semiconductor device according to an exemplary embodiment of the present invention. Referring to FIG. 6, the output buffer circuit 60 receives the output buffer reset signal EVCCHB_DQ, a data signal DOIB, the clock signal CLKDQ, and a data enable signal PTRST and generates an output data DQ. The output buffer circuit 60 includes a pull-up portion 62 and a pull-down portion 64.

The pull-up portion 62 receives the output buffer reset signal EVCCHB_DQ, the data signal DOIB, the clock signal CLKDQ, and the data enable signal PTRST and pulls up an output port DQ Pad to a third power voltage VDDQ. The pull-up portion 62 includes a first control logic portion 621, a first level shifter 623, a first output driver 625, a first latch portion 627, and a pull-up transistor P5.

The first control logic portion 621 is a circuit to control enable/disable of the first output driver 625 and includes an inverter i2, NOR gates NOR1 and NOR2, and a NAND gate NAND1. The first control logic portion 621 outputs a first signal U1 and a second signal U2. The data signal DOIB is a signal that is read out from the memory cell array (not shown).

The inverter i2 inverts the clock signal CLKDQ and outputs an inverted clock signal /CLKDQ. The NOR gate NOR1 performs a NOR operation of the data signal DOIB and the data enable signal /PTRST inverted by the first inverter i1 and outputs a third signal C5. The NAND gate NAND1 performs a NAND operation of the clock signal CLKDQ and the third signal C5. The NOR gate NOR2 performs a NOR operation of the inverted clock signal /CLKDQ and the third signal C5 and outputs the second signal U2.

The first level shifter 623 generates a signal L1 obtained by converting the first signal U1 based on the first power VDD and the second power VSS to a predetermined level. Also, the first level shifter 623 includes a switch R1. The switch R1 is turned on in response to the output buffer reset signal EVCCHB_DQ of the first logic level, that is, a high level "1", and turns off the pull-up transistor P1 of the first output driver 625 to prevent an output node UPB from shifting to the high level "1".

The first output driver 625 includes a pull-up transistor P1 and a pull-down transistor N1. The pull-up transistor P1 is connected between the first power voltage VDD and the output node UPB. The pull-down transistor P2 is connected between the output node UPB and the second power voltage VSS. Also, a switch R3 is connected to the output node UPB and turned on in response to the output buffer reset signal EVCCHB_DQ of the first logic level, that is, the high level "1", so that the output node UPB is shifted to the low level "0".

Thus, when the output buffer reset signal EVCCHB_DQ is in the first logic level, that is, the high level "1", the switches R1 and R3 are turned on and accordingly the voltage of the output node UPB is at the low level "0" and the output of the first latch portion 627 is at the high level "1" so that the pull-up transistor P5 is turned off. The pull-down transistor N5 is also turned off, which will be described later. Thus, the output node DQ Pad of the output buffer circuit 60 is in a high impedance state.

The pull-up transistor P1 and the pull-down transistor N1 are turned on and turned off respectively in response to the signal L1 obtained by converting the first signal U1 to a predetermined level and the second signal U2. The first latch portion 627 latches a signal output from the first output driver 625. The pull-up transistor P5 is turned on when the output signal of the first latch portion 627 is at the low level "0". Accordingly, current is supplied from the third power node VDDQ to the output node DQ Pad so that the output signal is pulled up to the third power node VDDQ level.

The pull-down portion 64 includes a second control logic portion 641, a second level shifter 643, a second output driver 645, a second latch portion 647, and a pull-down transistor N5. The second control logic portion 641 is a circuit to control the enable/disable of the second output driver 645 and includes an inverter i4, NAND gates NAND2 and NAND4, and a NOR gate NOR3. The second control logic portion 641 outputs a first signal D1 and a second signal D2 in response to the data signal DOIB, the clock signal CLKDQ, and the data enable signal PTRST after the inverted data enable signal /PTRST is further inverted by the inverter i3. The data signal DOIB is a signal that is read out from the memory cell array (not shown).

The inverter i4 inverts the clock signal CLKDQ and outputs the inverted clock signal /CLKDQ. The NAND gate NAND2 performs a NAND operation of the data enable signal PTRST output from the inverter i3 and the data signal DOIB and produces a third signal C7. The NOR gate NOR3 performs a NOR operation of the inverted clock signal /CLKDQ inverted by the inverter i4 and the third signal C7 and outputs the second signal D2. The NAND gate NAND4 performs a NAND operation of the clock signal CLKDQ and the third signal C7 and outputs the first signal D1.

The second level shifter 643 generates a signal M1 obtained by converting the first signal D1 based on the first power VDD and the second power VSS to a predetermined level. Also, the second level shifter 643 includes a switch R2. The switch R2 is turned on in response to the output buffer reset signal EVCCHB_DQ of the first logic level, that is, the high level "1", and the signal M1 turns off the pull-up transistor P3 of the second output driver 645.

The second output driver 645 includes the pull-up transistor P3 and a pull-down transistor N3. The pull-up transistor P3 is connected between the first power voltage VDD and an output node DNB. The pull-down transistor N3 is connected between the output node DNB and the second power voltage VSS. Also, a switch R4 is connected to the output node DNB and turned on when the output buffer reset signal EVCCHB_DQ is at the first logic level, that is, the high level "1", so that the output node DNB is shifted to the high level "1".

Thus, when the output buffer reset signal EVCCHB_DQ is at the first logic level, that is, the high level "1", the switches R2 and R4 are turned on and accordingly the voltage of the output node DNB is at the high level "1" and the output of the second latch portion 647 is at the low level "0" so that the pull-down transistor N5 is turned off. Thus, the output node DQ Pad of the output buffer circuit 60 is in a high impedance state.

The pull-up transistor P3 and the pull down transistor N3 are turned on and turned off respectively in response to the signal M1 obtained by converting the first signal D1 to a predetermined level and the second signal D2. The second latch portion 647 latches a signal output from the second output driver 645. The pull-down transistor N5 is turned on when the output signal of the second latch portion 647 is at the high level "1". Accordingly, by discharging current from the output node DQ Pad to a fourth power node VSSQ the output signal DQ is pulled down to the fourth power node VSSQ level.

Figure 3:
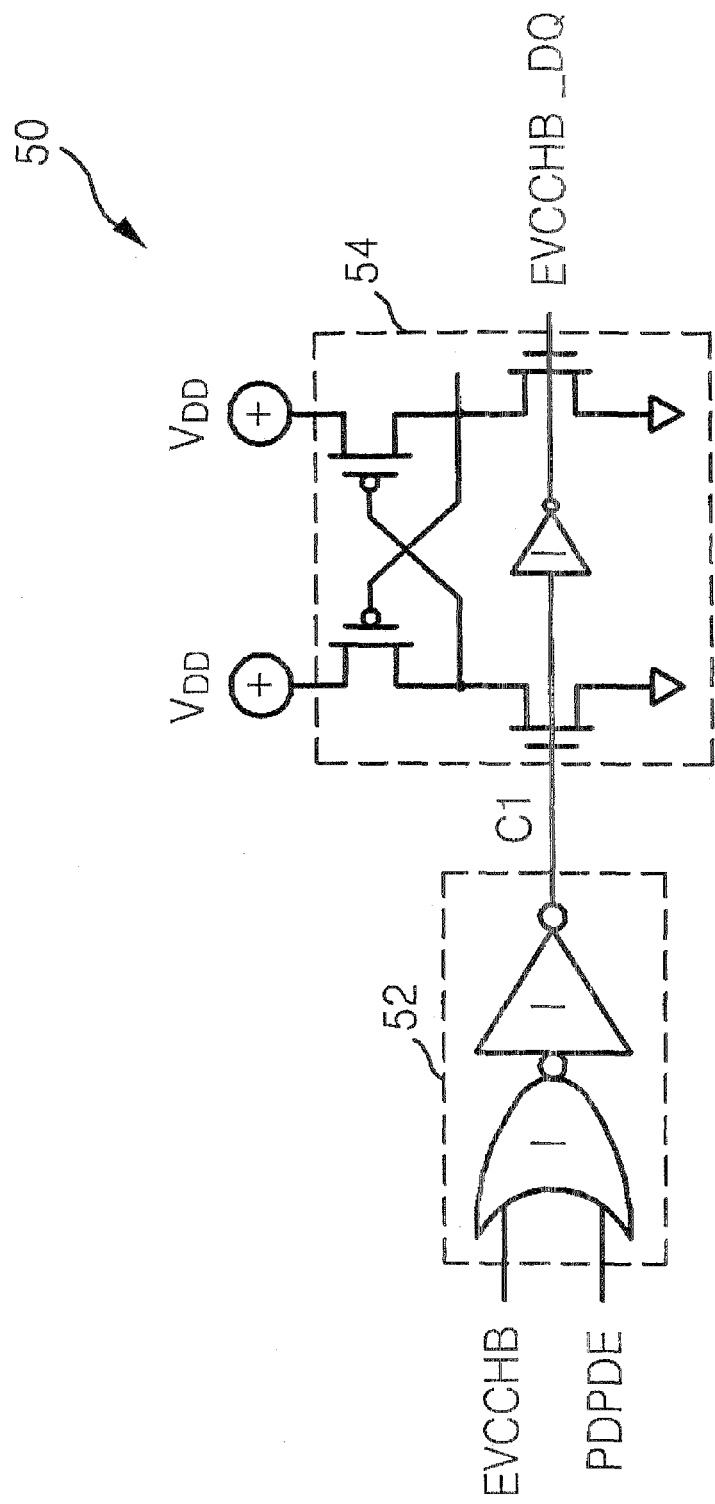
FIG. 3 is a circuit diagram of an output buffer initialization circuit of the conventional semiconductor device.
Figure 7:
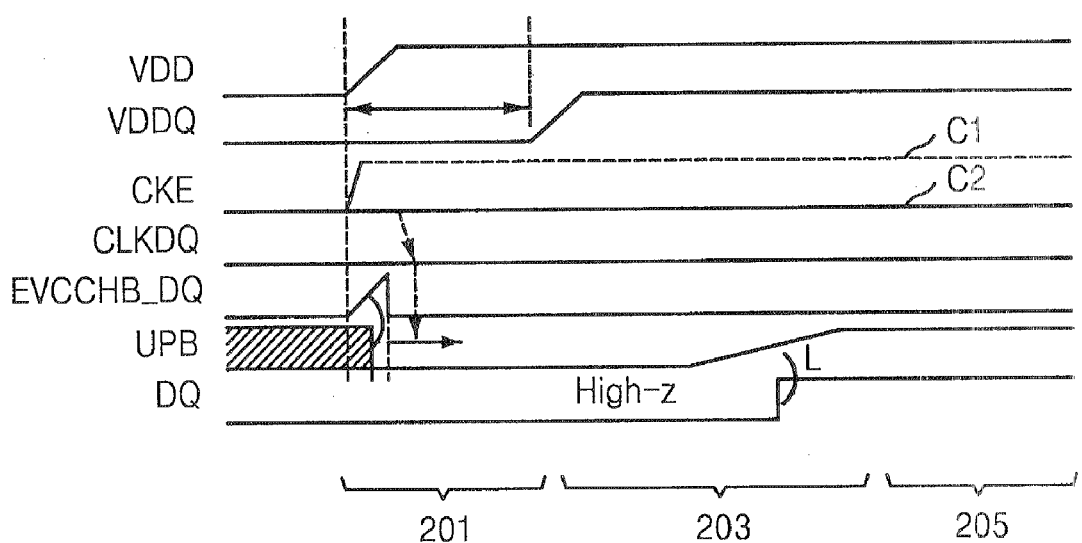
FIG. 7 is an operational timing diagram of an output buffer of a semiconductor device.

FIG. 7 is an operational timing diagram of an output butter of a conventional semiconductor device. It is assumed that the conventional semiconductor device includes the output buffer initialization circuit shown in FIG. 3 and an output buffer circuit similar to the one shown in FIG. 6. Referring to FIGS. 3, 6, and 7, the output buffer reset signal EVCCHB_DQ rises to the high level "1" during the power up section 201 of the first power VDD. When the first power VDD is constantly supplied, the output buffer reset signal EVCCHB_DQ is at the low level "0" in sections 203 and 205.

Thus, when a clock enable signal CKE output from a controller (not shown) of the semiconductor device is at the low level "0" and, thus, the clock signal CLKDQ is at the low level "0", the output buffer reset signal EVCCHB_DQ is at the high level "1" at the output port UPB of FIG. 6 and a high impedance state is maintained.

The output port UPB is at the high level "1," however, when the leakage current Ip of the first output driver 625 is greater than In and the output port DOK of the first latch portion 627 is at the low level "0," so that the current can be supplied from the third power node VDDQ to the output node DQ Pad (L of FIG. 7). That is, it can be seen that the output data of the memory device 20 in the multi-chip package 10 of FIG. 1 may collide with the output data of the other memory device 30.

Figure 8:
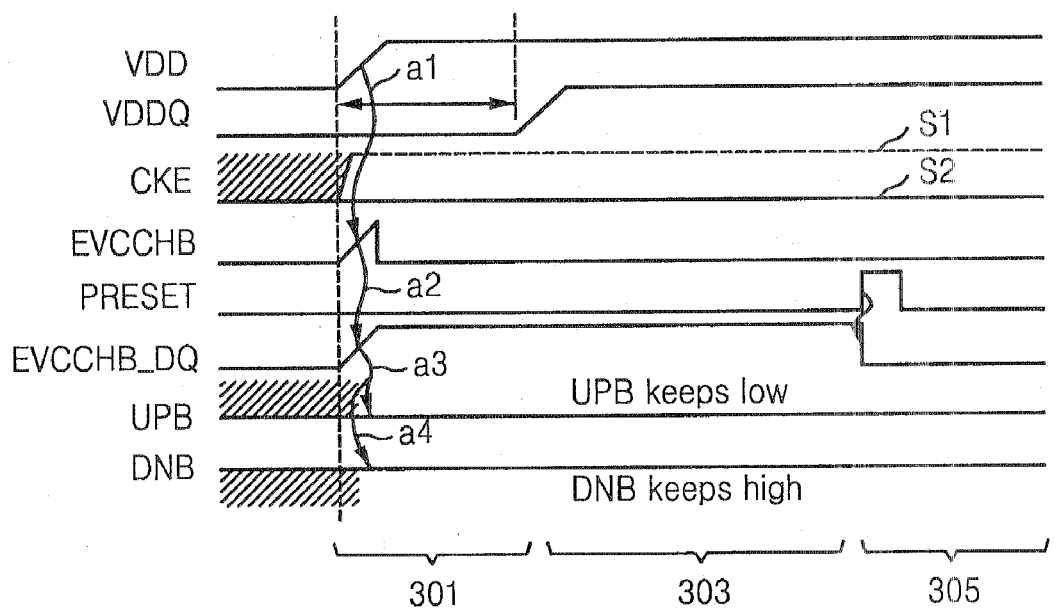
FIG. 8 is an operational timing diagram of an output buffer of a semiconductor device according to an exemplary embodiment of the present invention.

FIG. 8 is an operational timing diagram of the output buffer of a semiconductor device according to an exemplary embodiment of the present invention. Referring to FIGS. 4 through 8, the first set signal EVCCHB is at the high level "1" only in the power-up section 301 of the first power VDD and in the lower level "0" in the sections 303 and 305 in which the first power VDD is constantly supplied.

The output buffer reset signal EVCCHB_DQ is at the high level "1" in the power-up section 301 of the first power VDD and shifted to the low level "0" when the first signal PRESET is shifted to the high level "1". The first signal PRESET is a predetermined command signal input before the read command signal is input to the semiconductor memory device. For example, the first signal PRESET is a predetermined command signal input before the read command signal is input and may be a precharge signal, a refresh signal, a write signal, an MRS (mode register set) signal, and an active signal.

Thus, the output buffer reset signal EVCCHB_DQ maintains the high level even when the clock enable signal CKE is at the low level "0" (S2), so that the clock signal CLKDQ is at the low level "0". While the output buffer reset signal EVCCHB_DQ is maintained at the high level "1", the voltage of the output port UPB of FIG. 6 is at the low level "0" VSSQ. Accordingly, the output port DOK of the first latch portion 627 is at the high level "1" so that the pull-up transistor P5 is turned off.

Also, the voltage of the node DNB of FIG. 6 is at the high level "1" VDDQ. Accordingly, the output port DOKB of the second latch portion 647 is at the low level "0" so that the pull-down transistor N5 is turned off. That is, both pull-up transistor P5 and pull-down transistor N5 are turned off so that the output node DQ Pad of the output buffer circuit 60 is in the high impedance state.

Figure 9:
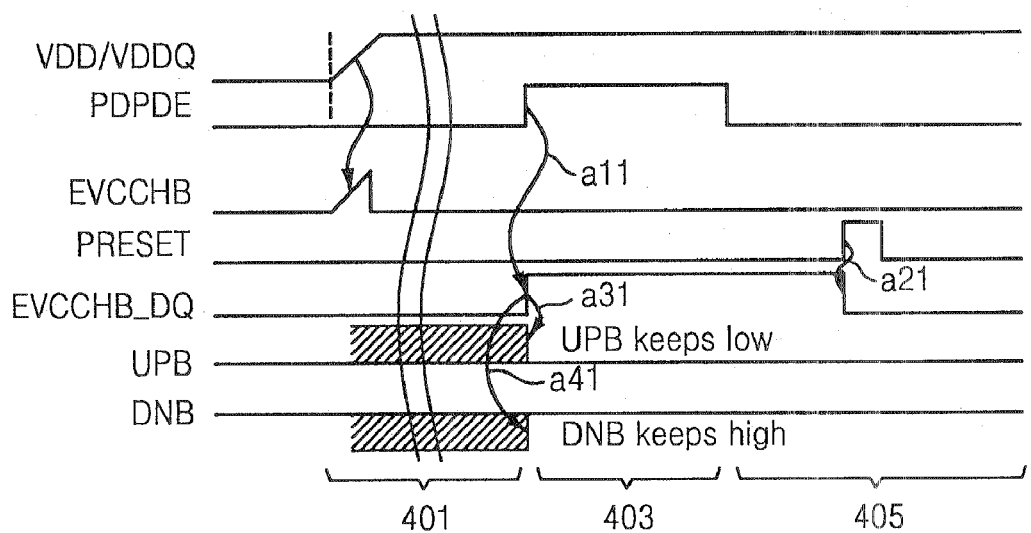
FIG. 9 is an operational timing diagram of an output buffer of a semiconductor device according to an exemplary embodiment of the present invention.

FIG. 9 is an operational timing diagram of the output buffer of a semiconductor device according to an exemplary embodiment of the present invention. Referring to FIGS. 4 through 9, the first set signal EVCCHB is at the high level "1" only in the power-up section 401 of the first power VDD and at the low level "0" when the first power is constantly supplied in the sections 403 and 405.

When the second set signal PDPDE is shifted to the high level "1" after a predetermined time 401 passes after the output buffer 60 is powered up, the output buffer reset signal EVCCHB_DQ is at the high level "1" (a11). The output buffer reset signal EVCCHB_DQ is at the low level "0" simultaneously when the first signal PRESET is shifted to the high level "1" (a21).

The second set signal PDPDE is a signal to enable the power down of the semiconductor device and is shifted to the high level "1" during power down (403). The first signal PRESET is a predetermined command signal input before the read command signal is input to the semiconductor memory device. The first signal PRESET is a predetermined command signal input before the read command signal is input to the semiconductor memory device. For example, the first signal PRESET is a predetermined command signal input before the read command signal is input and may be a precharge signal, a refresh signal, a write signal, an MRS (mode register set) signal, and an active signal.

Thus, the output data of the memory device 20, for example, a flash memory, of the multi-chip package 10 of FIG. 1 is not affected at all until the other memory device 30, for example, a DRAM, is accessed. While the output buffer reset signal EVCCHB_DQ maintains the high level "1", the voltage of the output port UPB of FIG. 6 is at the low level "0" VSSQ (a31). Accordingly, the output port DOK of the first latch portion 627 is at the high level "1" and the pull-up transistor P5 is turned off.

Also, the voltage of the node DNB of FIG. 6 is at the high level "1" VDDQ. Accordingly, the output port DOKB of the second latch portion 647 is at the low level "0" so that the pull-down transistor N5 is turned off. That is, as both pull-up transistor P5 and pull-down transistor N5 are turned off, the output node DQ Pad of the output buffer circuit 60 of FIG. 6 is in the high impedance state.

While the present invention has been particularly shown and described with reference to exemplary embodiments thereof, it will be understood by those skilled in the art that various changes in form and details may be made therein without departing from the spirit and scope of the invention as defined by the appended claims.

As described above, according to exemplary embodiments of the present invention the semiconductor device having the output buffer initialization circuit and the output buffer reset method operate such that when any one of memory chips of a multi-chip package is powered up or down in order to be reset, the data output from the other memory chip is not affected. Thus, according to the exemplary embodiments of the present invention, a possibility of generation of a data error in the multi-chip package having two or more memory devices is reduced.

What is claimed is:

1. A semiconductor device having at least two semiconductor memory devices, each of the semiconductor memory devices comprising:

a memory cell array having a plurality of memory cells arranged in a matrix of rows and columns;

a peripheral circuit writing data to a cell of the memory cell array and reading out and amplifying a written data; and an output buffer outputting cell data amplified by the peripheral circuit, wherein the output buffer comprises:

an output buffer initialization circuit activating an output buffer reset signal in response to the power up or power down of the semiconductor memory device and deactivating the output buffer reset signal in response to a first command signal output from a controller of the semiconductor memory device; and an output driver generating output data based on a data signal in response to a clock signal, a data enable signal, and the output buffer reset signal, wherein the output buffer initialization circuit comprises:

an output buffer reset circuit activating the output buffer reset signal based on a first set signal generated in response to the power up of the semiconductor memory device and a second set signal enabling the power down of the semiconductor memory device; and a latch circuit latching the output buffer reset signal, and wherein the output driver makes an output port in a high impedance state in response to the activation of the output buffer reset signal.

2. An output buffer comprising:

an output buffer initialization circuit activating an output buffer reset signal in response to the power up or power down of a semiconductor memory device and deactivating the output buffer reset signal in response to a first command signal output from a controller of the semiconductor memory device; and an output driver generating output data based on a data signal in response to a clock signal, a data enable signal, and the output buffer reset signal, wherein the output buffer initialization circuit comprises:

an output buffer reset circuit activating the output buffer reset signal based on a first set signal generated in response to the power up of the semiconductor memory device and a second set signal enabling the power down of the semiconductor memory device; and a latch circuit latching the output buffer reset signal, and wherein the output driver makes an output port in a high impedance state in response to the activation of the output buffer reset signal.

3. An output buffer comprising:

an output buffer initialization circuit activating an output buffer reset signal in response to the power up or power down of a semiconductor memory device and deactivating the output buffer reset signal in response to a first command signal output from a controller of the semiconductor memory device; and an output driver generating output data based on a data signal in response to a clock signal, a data enable signal, and the output buffer reset signal, wherein the output buffer reset circuit comprises:

a first inverter receiving the first signal;

a pull-up transistor connected between a first power voltage and an output node and turned on in response to an output signal of the first inverter; and a pull-down transistor connected between the output node and a second power voltage and turned on in response to an output signal of a logic gate block, wherein an output signal of the logic gate block is based on the first set signal and the second set signal.

4. The output buffer of claim 3, wherein the logic gate block comprises:

a NOR gate receiving the first set signal and the second set signal and performing an NOR operation; and a second inverter receiving an output signal of the NOR gate and outputting an inverted signal.

* * * * *